United States Patent
Zoso

(10) Patent No.: US 8,212,700 B2
(45) Date of Patent: Jul. 3, 2012

(54) DELTA-SIGMA-DELTA MODULATOR

(75) Inventor: Luciano Zoso, Chandler, AZ (US)

(73) Assignee: Stellamar LLC, Chandler, AZ (US)

( * ) Notice: Subject to any disclaimer, the term of this patent is extended or adjusted under 35 U.S.C. 154(b) by 57 days.

(21) Appl. No.: 12/832,703

(22) Filed: Jul. 8, 2010

(65) Prior Publication Data
US 2011/0006937 A1    Jan. 13, 2011

Related U.S. Application Data

(60) Provisional application No. 61/224,292, filed on Jul. 9, 2009.

(51) Int. Cl.
*H03M 3/00* (2006.01)
(52) U.S. Cl. .................. 341/143; 341/155
(58) Field of Classification Search .......... 341/144, 341/143, 155, 159
See application file for complete search history.

(56) References Cited

U.S. PATENT DOCUMENTS

| | | | |
|---|---|---|---|
| 5,057,840 A | 10/1991 | Ledzius et al. | |
| 5,729,230 A | 3/1998 | Jensen et al. | |
| 6,005,500 A | 12/1999 | Gaboury et al. | |
| 6,266,002 B1 | 7/2001 | Gong et al. | |
| 6,266,749 B1 | 7/2001 | Hashimoto et al. | |
| 6,340,940 B1 | 1/2002 | Melanson | |
| 6,351,229 B1 | 2/2002 | Wang | |
| 6,531,973 B2 | 3/2003 | Brooks et al. | |
| 6,885,327 B2 | 4/2005 | Zierhofer | |
| 6,975,682 B2 | 12/2005 | Cosand | |
| 6,980,144 B1 * | 12/2005 | Maloberti et al. | 341/143 |
| 6,985,098 B2 | 1/2006 | Lee | |
| 7,116,260 B2 * | 10/2006 | Luh | 341/155 |
| 7,183,957 B1 | 2/2007 | Melanson | |
| 7,298,306 B2 * | 11/2007 | Melanson | 341/143 |
| 7,345,608 B2 | 3/2008 | Tu et al. | |
| 7,961,126 B2 * | 6/2011 | Deval et al. | 341/131 |
| 2003/0058146 A1 | 3/2003 | Sundquist et al. | |
| 2003/0151532 A1 | 8/2003 | Chen et al. | |
| 2003/0179116 A1 | 9/2003 | Oki | |
| 2003/0184463 A1 | 10/2003 | Zierhofer | |
| 2004/0113824 A1 | 6/2004 | Zierhofer | |
| 2004/0196169 A1 | 10/2004 | Zierhofer | |
| 2004/0222909 A1 | 11/2004 | Wang | |
| 2005/0162297 A1 | 7/2005 | Zierhofer | |
| 2007/0222656 A1 | 9/2007 | Melanson | |
| 2008/0165043 A1 | 7/2008 | Wiesbauer et al. | |
| 2008/0204160 A1 | 8/2008 | Prodic et al. | |
| 2008/0204290 A1 | 8/2008 | Parayandeh et al. | |
| 2008/0316076 A1 | 12/2008 | Dent et al. | |

OTHER PUBLICATIONS

Mike Gaboury et al., "Delta-Sigma-Delta Modulator: . . . ", publication, 1997, 4 pages, 1997 IEEE International Symposium on Circuits and Systems, Jun. 9-12, 1997 Hong Kong.

Hooman Farkhani et al., "A Fully Digital ACD . . . ", publication, 2008, 4 pages, IEEE 978-1-4244-1684-4/08.

(Continued)

*Primary Examiner* — Brian Young
(74) *Attorney, Agent, or Firm* — Michael J. Balconi-Lamica

(57) ABSTRACT

An Analog-to-Digital Converter (ADC) is provided. An embodiment of the ADC includes a modified Delta modulator including a digital feedback loop, and a digital Sigma-Delta modulator configured within the feedback loop. Embodiments of the invention provide analog functionality with all the benefits of a digital design process as well as various other advantages provided by a Delta-Sigma-Delta modulator configuration.

44 Claims, 8 Drawing Sheets

OTHER PUBLICATIONS

Jinyuan Wu et al., "ADC and TDC Implemented Using FPGA", publication, 2007, 6 pages, 2007 IEEE Nuclear Science Symposium Conference Record, 1-4244-0923-3/07.

Fu-Yuan Wang et al., "Implementation of a Quasi-digital ADC on PLD", publication 2006, 3 pages, 1-4244-0161-5/06.

Xilinx, "XPS Delta-Sigma Analog . . . ", product specification, Dec. 2, 2009, 20 pages.

Fabio Sousa et al., "Taking Advantage of LVDS . . . ", publication, 2004, 4 pages, 0-7803-8251-X/04 I-1088 ISCAS 2004.

* cited by examiner

DELTA-SIGMA-DELTA MODULATOR

CROSS-REFERENCE TO RELATED PATENT APPLICATION

This patent application claims the benefit of U.S. Provisional Patent Application No. 61/224,292, filed Jul. 9, 2009, the entire teachings and disclosure of which are incorporated herein by reference thereto.

FIELD OF THE INVENTION

This invention generally relates to converters, and more specifically to Analog-to-Digital converters.

BACKGROUND OF THE INVENTION

Analog-to-Digital Converters (ADCs) are commonly used components in electronic systems. As they contain complex analog circuits, their design, implementation, and fabrication are difficult, time-consuming, and costly.

Integration of analog circuitry presents several issues that are not present when integrating digital circuits. Analog circuitry typically requires longer design cycles. Analog circuitry also lacks accurate models to detect failure and reduced performance often necessitating costly chip re-spins. In addition, the layout of analog circuits strongly affects the circuits' performance. Process changes also require redesign of the analog circuits. The performance of analog circuits is susceptible to temperature changes and is affected by component precision. Analog circuits are not suitable for applications which require very low supply voltages. Radiation hardening is difficult, lengthy and expensive. Finally, testability of analog circuits is more complicated.

Most ADCs can be classified into two groups based on the sampling frequency: Nyquist rate and oversampling converters. Nyquist rate converters sample the analog signals at a rate equal to twice the signal bandwidth, while oversampling converters use a much higher sampling frequency to convert the same signal. Single slope integrating, dual slope integrating, successive approximation, and flash converters are examples of Nyquist converters, while Delta and Sigma-Delta converters are examples of oversampling converters. Although Nyquist ADCs can achieve much higher conversion speeds than oversampling converters, their resolution heavily depends on the precision of their components. In fact often they require precise component matching or laser trimming which increases the manufacturing cost. On the contrary Sigma-Delta ADCs can relatively easily achieve very high resolutions while using low-cost CMOS processes. Moreover oversampling ADCs require only simple external analog anti-aliasing filters, because most of the anti-aliasing filtering is performed internally in the digital domain.

The basic Delta modulation systems were developed in the mid 1940's to encode analog signals such as speech into binary signals and to decode them. The modulators were based on $1^{st}$ and $2^{nd}$ order analog tracking loops which were successively improved with the addition of adaptive algorithms for the quantizer step size. Since there were already some stability issues with $2^{nd}$ order systems due to the analog loop filter implementation, no attempt was made to increase the order of the tracking loops to improve their performance. Further developments were done only in the digital domain: adaptive digital Delta modulators were designed with the specific goal to encode and compress speech signals, while the task of digitizing the incoming analog speech signals was performed by traditional ADCs.

The functional structure of a Delta modulation system for speech coding applications is shown in FIG. 1A. The Delta modulator 100 produces a binary representation d(t) 102 of the analog input signal x(t) 104, which is transmitted over a channel. The decoder 120, shown in FIG. 1B recovers the transmitted analog signal x(t) 104 by filtering the received binary pulses d(t) 102 with the same filter 106 used in the feedback loop of the encoder. The clock frequency is much higher than the Nyquist rate. When the modulator 100 is tracking correctly, the input estimate y(t) 108 differs from the analog input signal x(t) 104 at any sampling instant by an amount which is less than the step size D. This situation is depicted in FIG. 2 for a $1^{st}$ order Delta modulator with a pure integrator in the feedback loop. In the example of FIG. 1A, the sample & hold circuit 110 is assumed to hold the signal for a very small fraction of the sampling interval T 112 (shown in FIG. 2), thus generating very short binary pulses d(t) 102. When the binary pulses d(t) 102 are integrated by the integrator, the resulting input estimate waveform y(t) 108 consists of steps 114 with amplitude ±D and duration T, which oscillate about the analog input signal x(t) 104. A $2^{nd}$ order modulator can track the input with a better approximation. Instead of a step signal, it produces a signal with ramps which tracks the analog signal x(t) 104 with a smaller error.

FIG. 3 shows a $1^{st}$ order Delta modulator 130 used to convert the analog input signal x(t) 104 into the digital domain. The loop filter 106 is implemented with an external RC circuit. A decimator 132 downsamples the 1-bit signal to a lower rate (greater or equal to twice the signal bandwidth) and produces a multi-bit digital representation 133 of analog input signal x(t) 104. A flip-flop 134 and the decimator 132 are implemented in a Field-Programmable Gate Array (FPGA) 136. Also, a differential input of the FPGA 136 is used as a comparator 138. Any integrated circuit could be used instead of the FPGA.

Generally, Delta modulators have some issues: performance dependency on both amplitude and frequency of the input signal, stability problems with $2^{nd}$ order loops, and oversampling frequencies too high to achieve adequate resolutions for more general purpose applications than voice devices. Due to these limitations, they were rarely used as ADCs except for some speech signal applications with low quality requirements.

It was the Sigma-Delta modulators developed in the early 1960's that, by addressing most of the limitations of the Delta modulators, became the technology of choice for ADCs in the audio signal range and later for higher frequency ranges. At the same time digital Sigma-Delta modulators, being fully digital and technology independent, quickly replaced traditional Digital-to-Analog converters (DACs) in similar applications.

Conventional Sigma-Delta modulators are mainly used to realize high-resolution, but, at the same time, cost-effective ADCs and DACs for applications such as consumer and professional audio, communications systems, sensors, and precision measurement devices. Several topologies have been adopted to implement them (e.g., single-loop, multiple-loop, combinations of $1^{st}$ order and $2^{nd}$ order modulators, and so on), but the basic functional structure of conventional Sigma-Delta modulators for ADCs 140 and DACs 150 is shown in FIG. 4 and FIG. 5. The comparators 143 and 142 can be replaced with a multi-bit quantizer to improve performance. The filter A(s) 144 is implemented inside the chips with switched-capacitor technology or continuous-time circuits. Typically, the modulators of Sigma-Delta DACs, such as the one of FIG. 5, are fully digital.

Even though conventional Delta and Sigma-Delta ADCs present some advantages compared to Nyquist ADCs (e.g. they do not require precision analog components and sophisticated analog anti-aliasing filters), they still require complex analog circuits.

Therefore, it would be advantageous if an ADC were largely digital, thus reducing the problems encountered in the integration of traditional ADCs.

Embodiments of the invention provide an ADC which, utilizing the benefits provided by a Delta-Sigma-Delta configuration, can be easily integrated in the digital CMOS technology without requiring any special processing step.

These and other advantages of embodiments of the invention, as well as additional inventive features, will be apparent from the description of the invention provided herein. In the paragraphs below, the terms "Sigma-Delta modulator" and "Sigma-Delta DAC" are used interchangeably.

BRIEF SUMMARY OF THE INVENTION

In one aspect, embodiments of the invention provide a Delta-Sigma-Delta modulator. The Delta-Sigma-Delta modulator includes a modified Delta modulator including a digital feedback loop, and a Sigma-Delta Digital-to-Analog converter (DAC) configured in the feedback loop. In an embodiment, the Delta-Sigma-Delta modulator is configured to receive an analog input signal and is also configured to produce a digital output signal, the digital output signal being a digital estimate of the analog input signal.

In another aspect, embodiments of the invention provide an Analog-to-Digital converter that includes a Delta-Sigma-Delta modulator having an input configured to receive an analog input signal, and an output configured to supply a digital signal. Embodiments of the Analog-to-Digital converter further include a digital Sigma-Delta modulator in the feedback loop.

In another aspect, embodiments of the invention provide an Analog-to-Digital converter that includes a Delta-Sigma-Delta modulator having a modulator input configured to receive an analog input signal, and a modulator output configured to supply a digital signal. The digital signal is a digital estimate of the analog input signal. In a particular embodiment, the Delta-Sigma-Delta modulator includes a comparator that has a first input for receiving the analog input signal, a second input for receiving an analog estimate of the analog input signal, and a comparator output. The Delta-Sigma-Delta modulator also includes a digital loop filter coupled to the comparator output for providing, on the modulator output, the digital estimate of the analog input signal. Further, the Delta-Sigma-Delta modulator includes a Sigma-Delta Digital-to-Analog Converter (DAC) configured to convert the digital estimate of the analog input signal into the analog estimate of the analog input signal.

In yet another aspect, embodiments of the invention provide a method of Analog-to-Digital conversion that includes the steps of receiving, as an input to a Delta-Sigma-Delta modulator, an analog input signal, and comparing the voltage level of the analog input signal to the voltage level of an analog estimate of the analog input signal. In an embodiment, the analog estimate of the analog input signal is provided by a feedback loop. An embodiment of the invention further includes generating a digital estimate of the analog input signal by filtering, with a digital loop filter, the results of the comparison of the voltage level of the analog input signal to the voltage level of the analog estimate of the analog input signal, and converting the digital estimate of the analog input signal into an analog estimate of the analog input signal.

In another aspect, embodiments of the invention provide an Analog-to-Digital converter that includes a Delta-Sigma-Delta modulator having a modulator input configured to receive an analog input signal, and a modulator output configured to supply a digital signal. The digital signal is a digital estimate of the analog input signal. In a particular embodiment, the Delta-Sigma-Delta modulator includes a multi-bit quantizer that has a first input for receiving the analog input signal, a second input for receiving an analog estimate of the analog input signal, and a multi-bit quantizer output. The Delta-Sigma-Delta modulator also includes a digital loop filter coupled to the multi-bit quantizer output for providing, on the modulator output, the digital estimate of the analog input signal. Further, the Delta-Sigma-Delta modulator includes a Sigma-Delta Digital-to-Analog Converter (DAC) configured to convert the digital estimate of the analog input signal into the analog estimate of the analog input signal.

Other aspects, objectives, and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

As discussed briefly above, there are various drawbacks to using complex analog circuitry to implement Analog-to-Digital converters (ADCs). An ADC utilizing mostly digital circuitry could offer several advantages. As described in detail below, embodiments of the present invention provide an ADC utilizing a Delta-Sigma-Delta configuration that has mostly digital circuitry.

Figure 1A:
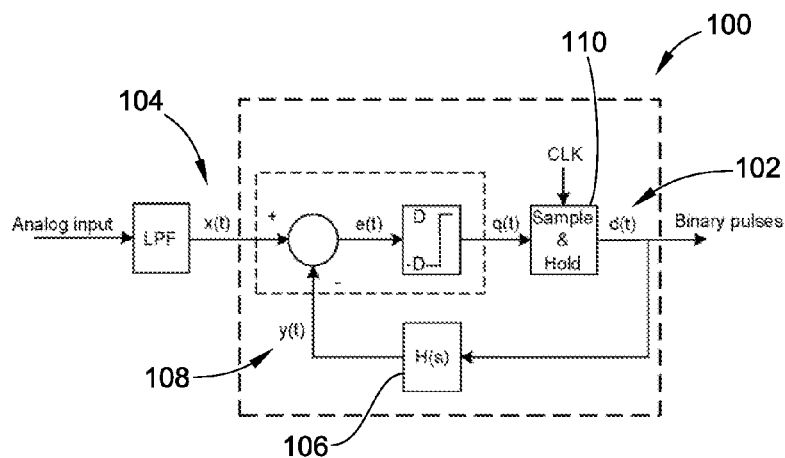
FIG. 1A is a block diagram of a prior art Delta modulation system encoder.
Figure 6:
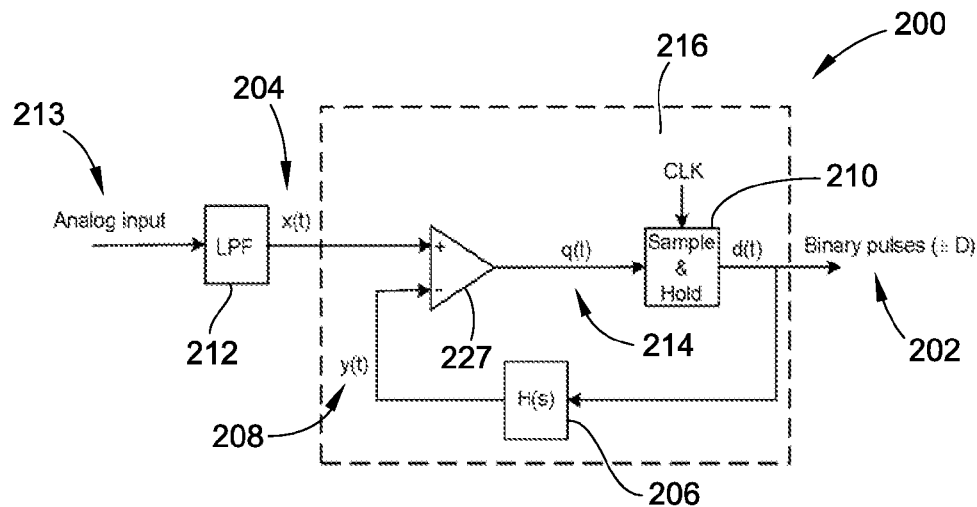
FIG. 6 is a block diagram of a prior art Delta modulator-based converter.

FIG. 6 illustrates a Delta modulator-based converter 200 comprising an analog tracking loop which converts a low-pass filtered analog input signal x(t) 204 with maximum amplitude $A_M$ and bandwidth $f_B$ into a binary representation d(t) 202 sampled at the oversampling rate $f_S$. It generates also an analog input estimate y(t) 208 of the analog input signal x(t) 204 which is used to compute the quantized tracking error q(t) 214. The basic architecture is shown in FIG. 6 which differs from FIG. 1A only because the subtractor and quantizer are implemented with a comparator 227. The frequency of the clock CLK is $f_S$.

The analog input is low-pass filtered by the filter LPF 212 to reject out-of-band noise. The quantized error signal q(t) 214 is generated by comparing the analog input estimate y(t) 208 with the analog input signal x(t) 204. The quantized error q(t) 214 can only assume ±D values according to the sign of the error and is sampled by a sample & hold circuit 210 at the sampling frequency $f_S$. The binary output d(t) 202 of the sample & hold circuit 210 is filtered by the loop filter 206, thus generating the analog input estimate y(t) 208.

The Delta modulator-based converter 200 is similar to a classic analog tracking loop described in the Control Theory with the main difference that the tracking error 214 is quantized and sampled. In the original implementation, the loop filter 206 consisted of a first or second order filter. The tracking characteristics depend on the loop filter 206, the sampling frequency $f_S$ and the quantizer step size D. Since the circuit is analog, the Laplace transform H(s) is used to describe the transfer function of the loop filter 206. From the view point of integration, the Delta modulator-based converter 200 does not present any advantage compared to a conventional Sigma-Delta ADC or any other traditional ADC, because all of its components are analog. Therefore it does not solve the problem of reducing the amount of analog circuitry.

Figure 1B:
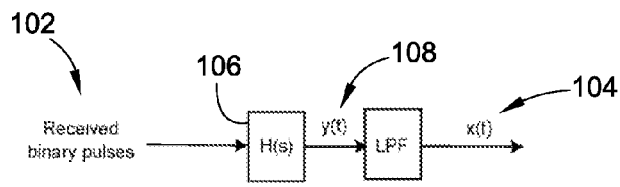
FIG. 1B is a block diagram of a prior art Delta modulation system decoder.
Figure 2:
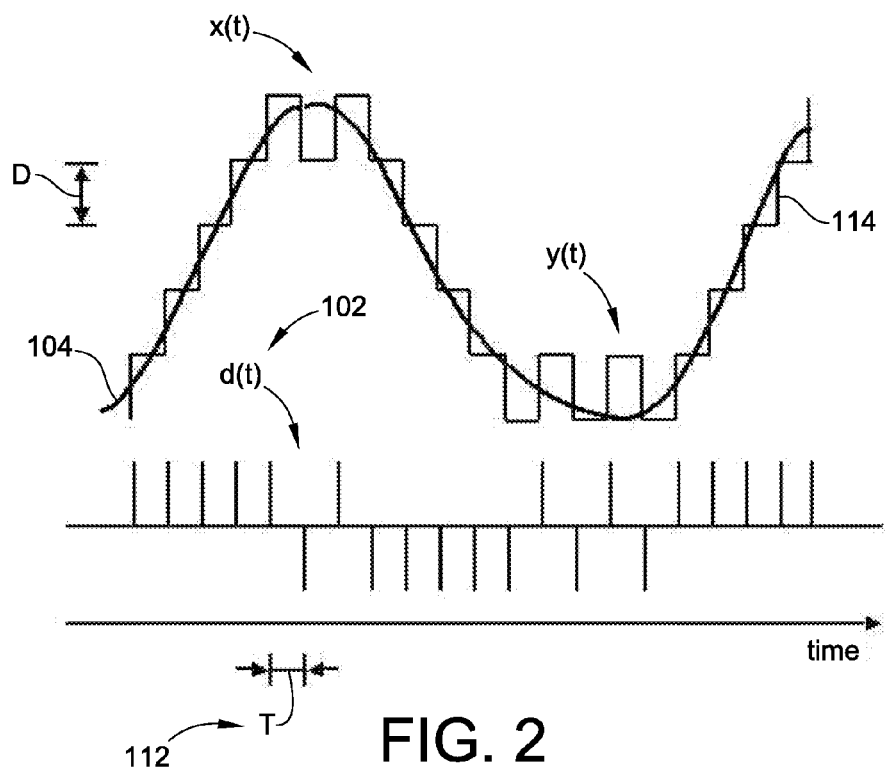
FIG. 2 is a graphical illustration of a first order Delta modulator with a pure integrator.
Figure 3:
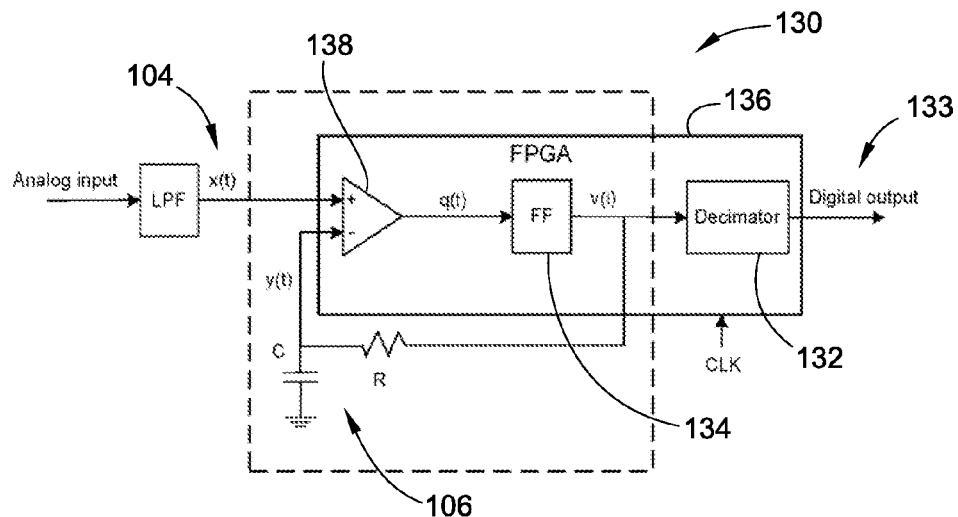
FIG. 3 is a block diagram of a prior art ADC using a Delta modulator with an RC filter.
Figure 4:
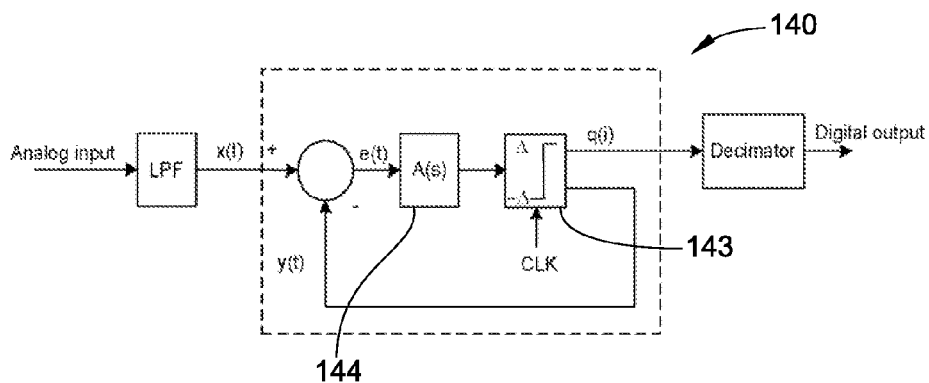
FIG. 4 is a block diagram of a prior art Sigma-Delta ADC.
Figure 7:
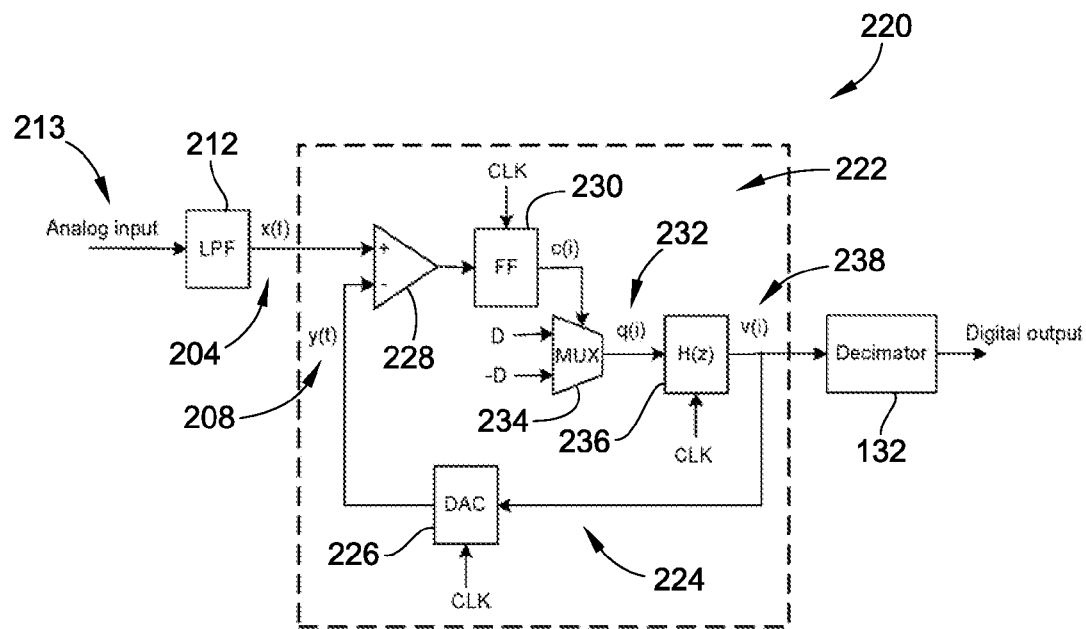
FIG. 7 is a block diagram of an Analog-to-Digital converter based on a modified Delta modulator with a digital feedback loop using a traditional Digital-to-Analog converter.

One possible way to reduce the complexity of the analog circuitry consists in replacing the analog loop filter 206 with a digital equivalent as shown in the embodiment of FIG. 7. As can be seen, FIG. 7 is a block diagram of an Analog-to-Digital converter (ADC) 220 based on a modified Delta modulator 222 with a digital feedback loop 224 using a Digital-to-Analog converter (DAC) 226. This is possible, because the output of comparator 228 is basically a 1-bit digital signal. For the sake of convenience, in the embodiment described below, the input device 228 will generally be described as comparator 228. However, one of skill in the art will recognize that, in the embodiments described herein, a digital differential input cell or a low voltage differential signal (LVDS) input cell 228 can be substituted for the comparator 228. A flip-flop 230 can sample the comparator 228 output at the frequency $f_S$. A digital quantized error q(i) 232 is generated by multiplexer 234 by selecting either +D or −D according to the output of the comparator 228. For analog input signal x(t) 204 and analog input estimate y(t) 208, when x(t)−y(t)>0 then q(i)=D, otherwise q(i)=−D. The inputs of comparator 228 could be reversed so that the analog input signal x(t) 204 is connected to the negative input terminal, but, in such a case, the sign of the feedback loop would need to be changed. The quantized error q(i) 232 is filtered by a digital loop filter 236, thus producing a digital estimate v(i) 238 of the analog input signal x(t) 204. As can be seen from FIGS. 6 and 7, as well as in FIGS. 1, 3 and 4, analog input signal x(t) is actually the output of low-pass filter 212, which filters analog input 213 to reject out-of-band noise. In alternate embodiments of the invention, the modified delta modulator 222 does not include flip-flop 230. The output of the multiplexer 234 can be sampled by the first register inside of the digital loop filter 236. In yet another embodiment, the comparator 228 provides the quantized error signal q(i) 232 so that the multiplexer 234 can be eliminated. With the comparator 228 coupled directly to the digital loop filter 236, the sampling of the comparator 228 output is performed by the first register of the digital loop filter 236.

As described later, the transfer function of the digital loop filter 236 is equivalent in the digital domain to the analog loop filter 206 (shown in FIG. 6) having transfer function H(s). A DAC 226 can convert v(i) 238 into the analog domain in order to be able to close the loop. The signal v(i) 238 is also sent to the decimator 132, which downsamples it to a lower sampling rate. FIG. 7 represents the functional structure of the ADC. Other hardware implementations could be used to achieve the same functionality.

Since it is preferable that the tracking performance is not affected by the presence of the DAC 226, the Signal-to-Noise ratio (SNR) of the DAC should be higher than the SNR of the ADC. If, for instance, the analog Delta modulator 216 (shown in FIG. 6) has an SNR of 60 dB over the bandwidth $f_B$, the DAC 226 could preferably have an SNR of at least 70 dB over the same bandwidth to achieve a similar performance with the modified Delta modulator 222 of FIG. 7.

The behavior of the modified Delta modulator 222 with digital feedback is equivalent to the behavior of the original analog modulator 216 of FIG. 6. It has the same SNR, and is subject to the same tracking conditions. Moreover, it still requires a simple analog anti-aliasing filter (i.e. low-pass filter 212). A traditional DAC 226 may or may not be a suitable choice, because its complexity could be higher than the one of the analog filter just removed. However, DACs based on Pulse Width Modulation (PWM) or similar techniques could be used in the modified Delta modulator 222 of FIG. 7. ADC 220 could have adequate performance and still be advantageous compared to traditional ADCs in regard to analog complexity. An analog low-pass filter (not shown in FIG. 7) could be needed after the DAC to reject the high-frequency spurs generated by the PWM DAC.

Another possible way to further reduce the analog complexity of the Delta modulator with digital feedback would be to replace the traditional DAC with a Sigma-Delta modulator followed by a simple smoothing filter. Compared to traditional DACs Sigma-Delta modulators are easier to integrate, because they are totally digital. As regards the output buffer several techniques have been presented in the literature to reduce the harmonic distortion introduced in the transition between the digital and analog domain. For some applications adequate performance can be achieved by using directly an output cell from the digital library. For other applications with more demanding requirements, the output buffer may require some modifications to reduce the harmonic distortion using techniques described in the literature, such as improving the symmetry of the rising and falling edges, and chopping the input of the buffer. Some techniques may require the use of analog circuitry, but this could reintroduce some of the issues typical of the analog design. Another technique may consist in redesigning the system in such a way that a lower oversampling frequency is needed, thus reducing the spurs produced by the digital output cell.

Figure 5:
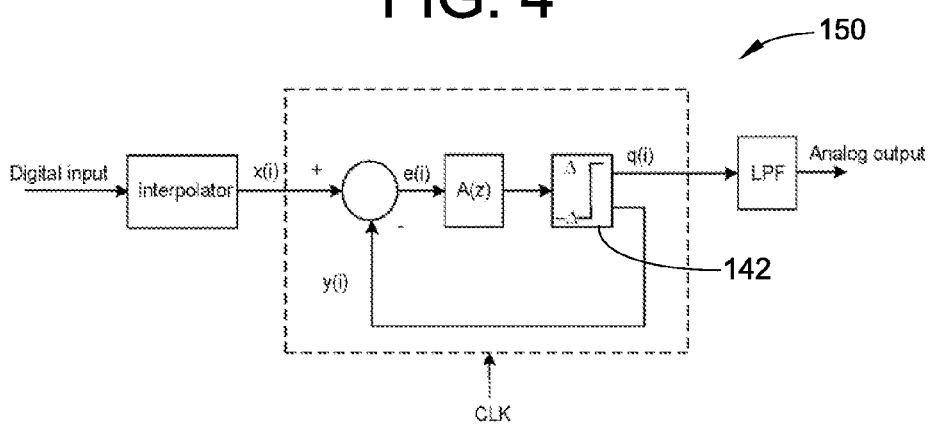
FIG. 5 is a block diagram of a prior art Sigma-Delta DAC.
Figure 8:
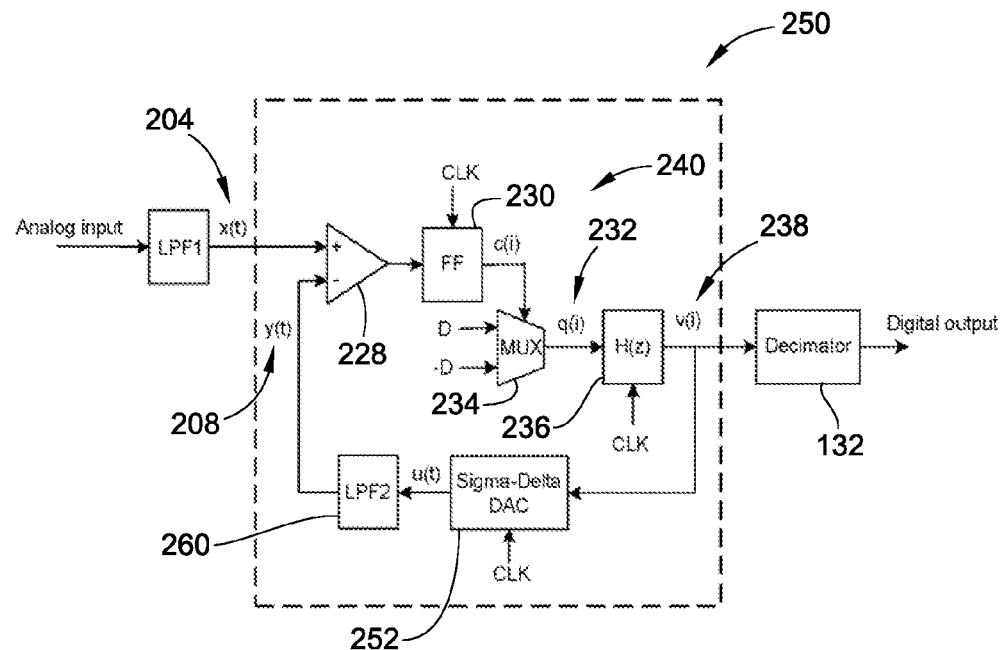
FIG. 8 is a block diagram of an exemplary embodiment of the present invention.
Figure 9:
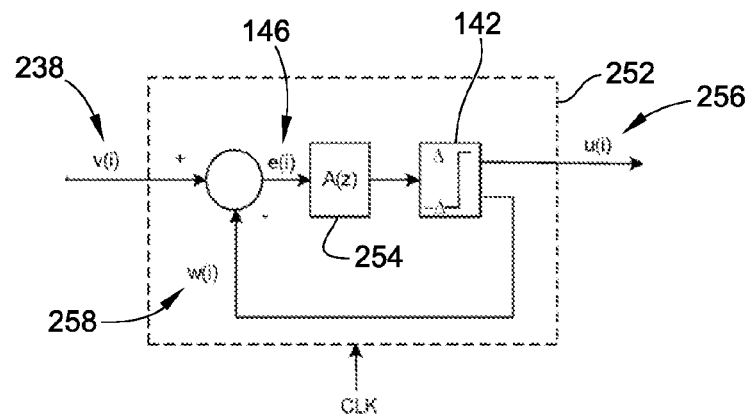
FIG. 9 is a block diagram of a digital Sigma-Delta modulator or Sigma-Delta DAC.

The basic structure of a Delta-Sigma-Delta ADC 250 is shown in FIG. 8. Other hardware implementations could be used to achieve the same functionality. In this embodiment, since flip-flop 230 and digital loop filter 236 are sampled at the same sampling frequency as the Sigma-Delta modulator 252, no interpolator is needed before the Sigma-Delta modulator, as shown in FIG. 5. An example of a Sigma-Delta DAC or modulator 252 is shown in FIG. 9, but other structures could be used as well. Digital loop filter 254 has a transfer function A(z). The input of the digital loop filter 254 is the error e(i) 146. The Sigma-Delta modulator 252 generates a 1-bit estimate u(i) 256 of the input v(i) 238 and the corresponding digital signal w(i) 258 with amplitudes ±Δ (Δ is a multi-bit digital value) which is used to produce the tracking error 146. The 1-bit estimate signal u(i) 256 is sent to an output buffer and filtered by the smoothing filter (LPF2) 260 of FIG. 8, thus producing the analog version (i.e., analog input estimate y(t) 208) of the input v(i) 238.

The new ADC 250 of FIG. 8 requires only a few analog components, mainly a comparator 228 and a simple smoothing filter 260. The comparator 228 can be implemented with a digital differential input cell or a low-voltage differential signal (LVDS) input cell 228 easily available in most of the digital libraries for integrated circuits. The analog smoothing filter 260 can be implemented with RC circuits and since the value of the corner frequency is not critical, as described later, it does not require precision components.

In the embodiment of FIG. 8, the Delta-Sigma-Delta modulator 240 is basically a modified Delta modulator 222 (shown in FIG. 7) with a digital feedback loop closed through a Sigma-Delta DAC 252. It is an oversampling tracking loop which converts an analog input x(t) 204 into a digital signal v(i) 238.

A decimator 132 filters v(i) 238 to reject the quantization noise produced by the Delta-Sigma-Delta modulator 240 and downsamples it to a frequency equal to or a little greater than twice the signal bandwidth. Alternatively, the decimator 132 could use q(i) 232 as an input, thus taking advantage of the fact that q(i) 232 is a 1-bit signal. However the decimator 132 output would need to be filtered by a filter with transfer function H(z). This could cause problems, because H(z) might have poles (complex and/or real) on the unit circle or slightly inside the unit circle. It could generate limit cycles or ringing at the frequency of the complex poles, if any, if implemented as a stand-alone filter. Based on complexity and noise considerations the decimator 132 for signal v(i) 238 may be preferable.

Due to the presence of two nonlinearities (comparator 228 of Delta-Sigma-Delta modulator 240 and quantizer 142 of Sigma-Delta modulator 252) the analytical study of the closed loop is extremely complicated and beyond the scope of this document. The following analysis relies partly on the information available about Delta and Sigma-Delta modulators and is based mostly on empirical results.

Figure 10:
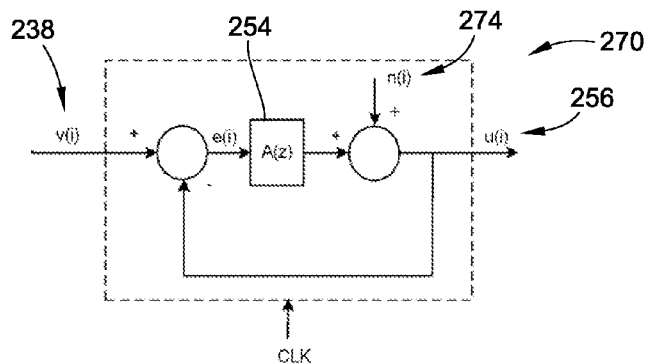
FIG. 10 is a block diagram of a linear model of the Sigma-Delta modulator or Sigma-Delta DAC of FIG. 9.

When the Sigma-Delta modulator 252 tracks correctly, the linear model 270 shown in FIG. 10 can be used to analyze the behavior of the non-linear loop of FIG. 9. The quantizer is modeled as an additive white noise n(i) 274, uncorrelated from the input signal v(i) 238, and having uniformly distributed density and variance depending on the quantizer 142 step size. The system can now be analyzed as a classic tracking loop with the following closed-loop functions:

$$STF(z)=U(z)/V(z)=A(z)/(1+A(z)) \quad (1)$$

$$NTF(z)=U(z)/V(z)=1/(1+A(z)) \quad (2)$$

where U(z), V(z) and N(z) are respectively the z-transforms of the output u(i) 256, input v(i) 238 and quantization noise n(i) 274. STF(z) is the signal transfer function. The response has an all-pass filter behavior in the tracking band and low-pass outside. It shows how accurate the input estimate is compared to the input. NTF(z) is the noise transfer function. The response has a high-pass filter behavior. It describes how the spectrum of the quantization noise n(i) 274 is shaped: the lower the in-band noise, the higher the SNR. The z-transform of the modulator output u(i) 256 is given by $$U(z)=STF(z)V(z)+NTF(z)N(z) \quad (3)$$

Assuming that $STF(z) \approx 1$, the z-transform U(z) of the output u(i) 256 of the Sigma-Delta DAC 252 and its spectrum $S_U(f)$ can be approximated with $$U(z) \approx V(z)+NTF(z)N(z) \quad (4)$$

$$S_U(f) \approx S_V(f)+S_{SN}(f) \quad (5)$$

where $S_V(f)$ and $S_{SN}(f)$ are respectively the spectra of the input and of the shaped quantization noise. Based on equations (4) and (5), the output u(i) 256 of a Sigma-Delta modulator 252 operating in its linear region can be represented with good approximation as its input v(i) 238 plus the shaped quantization noise produced by the modulator 252.

Moreover it is important to notice that at a parity of sampling frequency, signal bandwidth and order a Sigma-Delta DAC 252 has a much higher SNR than the one of a Delta modulator. This means that the Sigma-Delta DAC 252 produces a very accurate analog version of its digital input v(i) 238 which should not affect the overall performance. Nevertheless the Sigma-Delta modulator also produces a noise shaped by the transfer function NTF(z). The noise is very small in the band of interest, but it increases with the frequency reaching levels only a few dBs below the maximum signal amplitude at frequencies close to $f_S/2$. The situation worsens for smaller input levels. In fact as the signal decreases, its spectral line becomes smaller and smaller compared to the high frequency noise components. Due to the noise, the comparator 228 (shown in FIG. 8) may not be able to determine correctly the sign of the tracking error q(i) 232.

The Sigma-Delta modulator 252 itself, besides generating the quantization noise, seems to have minimal impact on the tracking loop performance: most of the problems are caused by the smoothing filter 260 (shown in FIG. 8). The task of the smoothing filter 260 is to reject this noise in such a way that the comparator 228 can work properly for all the dynamic range of the analog input signal x(t) 204. The larger the dynamic range, the higher the rejection the smoothing filter 260 must introduce.

The problem is made more complicated by the fact that the smoothing filter 260 is inside a closed loop. Filters with higher rejections do a better job at getting rid of the noise, but at the same time they have larger group delays. The smoothing filter 260 can introduce a delay of many cycles of the sampling frequency which dramatically reduces the performance of the tracking loop compared to Delta modulator 216 and modified Delta modulator 222 of FIG. 6 and FIG. 7, respectively, or, even worse, it can make it unstable. Also, if the corner frequency becomes too tight, the smoothing filter 260 can introduce some amplitude distortion as well, which further reduces the tracking performance. On the other hand, by reducing the rejection, the tracking improves but the noise increases, thus preventing the comparator 228 from working properly.

The smoothing filter 260 needs to be designed in such a way to reject the noise without affecting the tracking behavior of the Delta-Sigma-Delta modulator 240. A way of achieving this is to try to keep the corner frequency as far away as possible from the signal band. In the computation of the corner frequency, it is also necessary to take into account that the smoothing filter 260 is implemented with external components. Variations of the corner frequency due to component tolerance must not affect the ADC 250 performance. Moreover the zeros of the digital loop filter 236 of the Delta modulator 222 of FIG. 7 may need to be modified to partly compensate for the delay introduced by the smoothing filter 260, thus allowing the ADC 250 to reach a performance level similar to the one of the feedback loop with the traditional DAC 226 (shown in FIG. 7).

It is important to notice that, compared to the traditional Delta modulator-based converter 216 of FIG. 6, the smoothing filter 260 of the Delta-Sigma-Delta modulator 240 is used exclusively to reduce the noise produced by the Sigma-Delta modulator 252 and it does not perform the task of the loop filter 206 (shown in FIG. 6). The loop filter is implemented in the digital domain by the digital loop filter 236.

Figure 11:
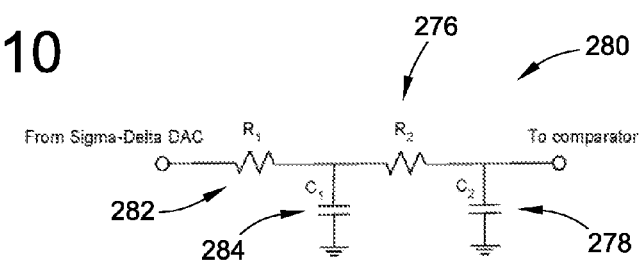
FIG. 11 is a schematic illustration of a second order filter implemented with RC components.
Figure 12:
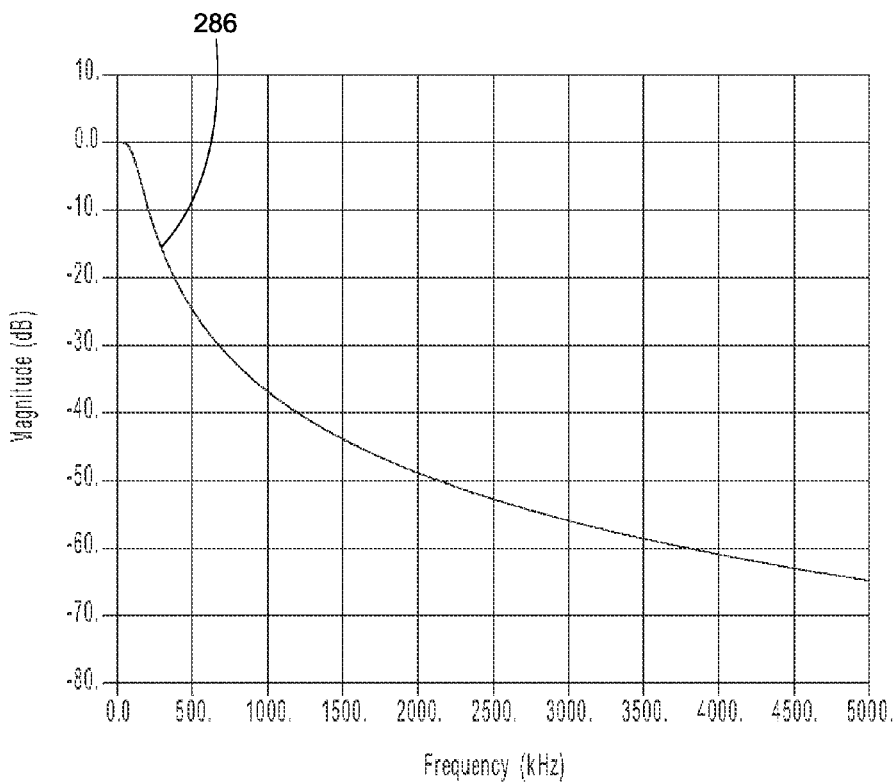
FIG. 12 is a graphical illustration of the amplitude response of a second order filter used to reject the noise of Sigma-Delta modulators.

A schematic of a $2^{nd}$ order filter 280 implemented with RC components 276, 278, 282, and 284 is shown in FIG. 11. It allows maximizing the rejection while keeping the group delay at a minimum. An example of amplitude response 286 is given in FIG. 12 for the Sigma-Delta modulator 252 (shown in FIG. 8) sampled at 10 MHz and for an ADC with an SNR of about 70 dB over a signal bandwidth of about 5 kHz. A filter with a single RC circuit could be used, if lower performance is required or a much higher sampling frequency is available or a combination of both occurs.

When the comparator 228 and digital loop filter 236 are sampled at the same sampling frequency of the DAC, Sigma-Delta DACs with higher order loops or with multi-bit quantizers can be used to reduce the filter requirements. The noise shaping can be used to relax the rejection requirements on the smoothing filter 260, thus reducing the group delay. For instance, instead of using a $2^{nd}$ order Sigma-Delta DAC, a higher order modulator can be used. The extra capabilities are used not to improve the SNR, which is already more than adequate, but to reduce the out-of-band noise near the band of interest. The noise shaping is used like a filter which adds extra rejection to the attenuation of the smoothing filter 260. Unfortunately, the noise shaping can be used only to reduce noise close to the band of interest. It is less effective for the stronger noise at higher frequencies.

In at least one embodiment, Sigma-Delta DACs with multi-bit quantizers can be used to reduce the complexity of the smoothing filter or to increase its corner frequency, thus allowing to increase the SNR even though the same sampling frequency and Delta modulator are used. The shape of the noise is the same compared to modulators of the same order with 1-bit quantizers, but the level is lower. As a consequence, they require less filtering. For instance spectra of a $2^{nd}$ order modulator with a 2-bit quantizer are 6 dB lower than the corresponding spectra of a $2^{nd}$ order modulator with a 1-bit quantizer. The out-of-band spectrum is also lower than the one for a higher order modulator sampled at the same sampling frequency. The embodiment of a Delta-Sigma-Delta modulator 240 using a Sigma-Delta DAC, or Sigma-Delta modulator, 252 with a multi-bit quantizer can still be depicted with the block-diagram of FIG. 8, but the Sigma-Delta modulator 252 of FIG. 9 uses a multi-bit quantizer 142 instead of a comparator. In a particular embodiment, the output of the multi-bit quantizer 142 is converted from digital to analog by a pulse-width modulation (PWM) DAC.

Another way to relax the smoothing filter requirements, or to get more rejection from the same filter, involves increasing the sampling frequency of the Sigma-Delta DAC 252 (with 1-bit or multi-bit quantizers). In this way, the same noise spectrum is now spread over a much wider frequency band. If, for instance, we compare the spectra of the same $2^{nd}$ order Sigma-Delta DAC 252 sampled at two different sampling frequencies, the spectrum of the one sampled with the higher clock rate grows more slowly as the frequency increases, and the filtered noise is smaller. By increasing just the sampling frequency of the Sigma-Delta DAC 252, the performance of the Delta-Sigma-Delta modulator 240 improves.

Figure 13:
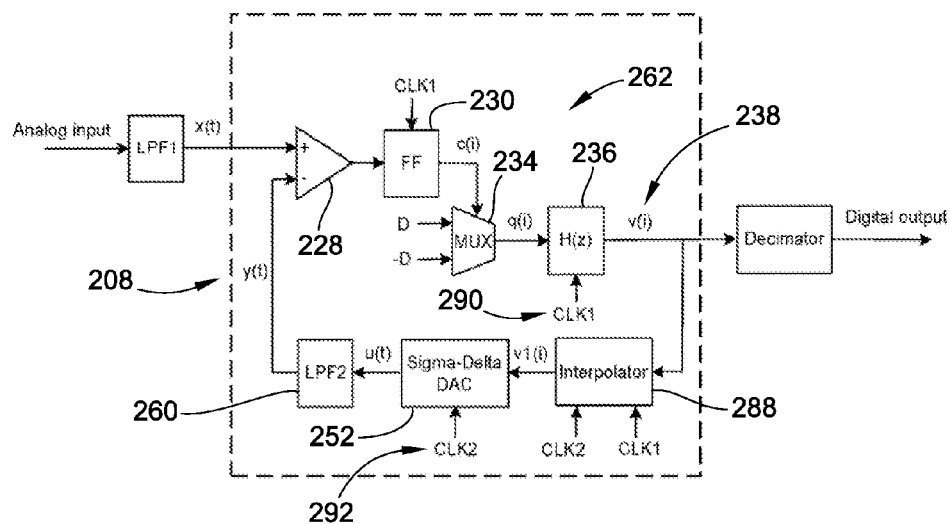
FIG. 13 is a block diagram of an ADC that includes a Delta-Sigma-Delta modulator having an interpolator, constructed in accordance with an embodiment of the invention.

The embodiment of the Delta-Sigma-Delta modulator 240 (shown in FIG. 8) could be modified by adding an interpolator 288 to increase the sampling frequency of the loop filter output v(i) 238, as shown in FIG. 13. The comparator 228 and digital loop filter 236 are sampled with the clock CLK1 290 ($f_S$), while the Sigma-Delta DAC 252 is sampled with the clock CLK2 292. As can be seen in FIG. 13, the interpolator 288 receives both CLK1 290 and CLK2 292 as inputs. The interpolator 288 is configured to operate the Sigma-Delta DAC 252 at a higher clock speed than the digital loop filter 236. Thus, in an embodiment, CLK2 292 is greater than CLK1 290. The interpolation can be achieved by just repeating the same sample a number of times equivalent to the interpolation factor −1. More sophisticated interpolation can also be used. The Sigma-Delta modulator 252 shown in FIG. 9, or one with the comparator 142 replaced with a multi-bit quantizer, can be used in the embodiment of FIG. 13.

In an alternate embodiment of the Delta-Sigma-Delta modulators shown in FIGS. 8 and 13, the respective modified delta modulators 240, 262 do not include flip-flop 230. The output of the multiplexer 234 can be sampled by the first register inside of the digital loop filter 236. In yet another embodiment, the comparator 228 provides the quantized error signal v(i) 232 so that the multiplexer 234 can be eliminated. With the comparator 228 coupled directly to the digital loop filter 236, the sampling of the comparator 228 output is performed by the first register of the digital loop filter 236.

Figure 14:
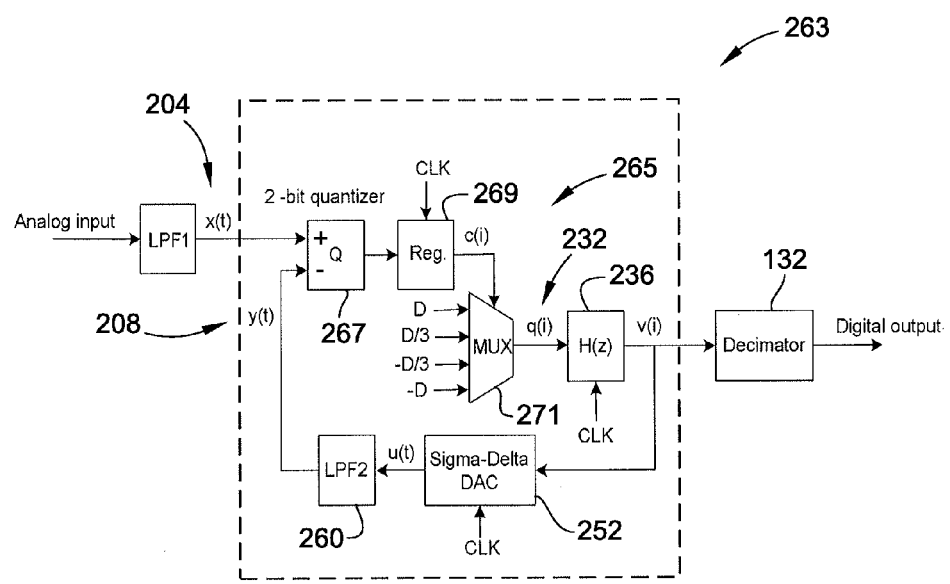
FIG. 14 is a block diagram of an ADC that includes a Delta-Sigma-Delta modulator having a multi-bit quantizer, constructed in accordance with an embodiment of the invention.

In at least one embodiment, the comparator 228 (i.e., a 1-bit quantizer), flip-flop 230 and multiplexer 234 of modulators 240 and 262, shown in FIG. 8 and FIG. 13, are replaced, as shown in FIG. 14. The ADC 263 of FIG. 14 includes a Delta-Sigma-Delta modulator 265 that has a 2-bit quantizer 267 followed by a 2-bit register 269, and a multiplexer 271 with four inputs. The 2-bit quantizer 267 produces a 2-bit digital representation of the difference between the analog input signal x(t) 204 and the analog estimate of the analog input signal y(t) 208.

In yet another embodiment with an N-bit quantizer, the register has N bits and the multiplexer has a number of inputs equivalent to two to the power of N. In the embodiment of FIG. 14, where the number of bits of the multi-bit quantizer 267 is two, the multiplexer 271 has four inputs whose values are D, D/3, −D/3, and −D. With all parameters being the same, the SNR can be increased by 6 dB for every bit added to the quantizer. For instance, in the case of a 2-bit quantizer such as that shown in FIG. 14, the performance may improve by 6 dB. By using multi-bit quantizers, the sampling frequency can be reduced or, at a parity of sampling frequency, the SNR can be increased, but this requires the use of more complicated analog blocks than comparators 228.

The analog transfer function H(s) of the $1^{st}$ and $2^{nd}$ order Delta modulators can be replaced by the digital equivalents H(z) with gains $G_1$ and $G_2$ $$H(z) = G_1/(1 - z_P z^{-1}) \quad (6)$$

$$H(z) = G_2[(1 - z_{O1} z^{-1})(1 - z_{O2} z^{-1})]/[(1 - z_{P1} z^{-1})(1 - z_{P2} z^{-1})] \quad (7)$$

The $1^{st}$ order modulator has a pole located at $z=z_P$, while the other has poles at $z=z_{P1}$ and $z=z_{P2}$ and zeros at $z=z_{O1}$ and $z=z_{O2}$. The zeros are used to stabilize the closed loop. For the circuit of FIG. 7, when the $2^{nd}$ order loop filter is used, only a zero is necessary to stabilize the loop. However when the DAC 226 is replaced with a Sigma-Delta modulator 252 and smoothing filter 260 as in the circuit of FIG. 8, both zeros are necessary to achieve stability and good tracking performance. In at least one embodiment, only pure integrators are used for the $1^{st}$ and $2^{nd}$ order Delta modulators, and therefore all the poles are located at $z=1$. Regarding the gains, $G_1 = G_2 = 1$.

Generally, in the literature only $1^{st}$ and $2^{nd}$ order Delta modulators are described. Higher order loops were not developed mainly because of stability issues with more than two integrators. First order loops are always stable, while second order loops can be stabilized by adding a zero. Loops using three integrators can still be stabilized by adding zeros, but one of them must be extremely close to the pole. As a consequence the performance improves very little compared to a $2^{nd}$ order loop. The problem gets worse by increasing the number of integrators. Furthermore, since in traditional Delta modulators the loop filter is implemented with external analog components, the task of implementing the filter is even more difficult.

One solution to this problem consists in adding complex poles to the $1^{st}$ and $2^{nd}$ order loop filters instead of real ones. This technique is used in the design of higher order modulators for Sigma-Delta ADCs and DACs, but it has never been applied to the design of Delta modulators. The transfer function of a higher order loop filter for a modified Delta modulator, such as that shown in FIG. 7, or for the Delta-Sigma-Delta modulators of FIGS. 8, 13, and 14, can be expressed as the product of two transfer functions $H_A(z)$ and $H_B(z)$:

$$H(z) = H(z)_A H(z)_B \quad (8)$$

where $H_A(z)$ can consist of a first order term with a pole at $z=z_P$ and a zero at $z=z_O$ $$H(z)_A = (1 - z_O z^{-1})/(1 - z_P z^{-1}) \quad (9)$$

or a second order term with real poles at $z=z_{P1}$ and $z=z_{P2}$ and zeros at $z=z_{O1}$ and $z=z_{O2}$ $$H(z)_A = [(1 - z_{O1} z^{-1})(1 - z_{O2} z^{-1})]/[(1 - z_{P1} z^{-1})(1 - z_{P2} z^{-1})] \quad (10)$$

while $H_B(z)$ is a product of M second order terms with complex poles at $z=r_{Pi} \exp(\pm j\phi_{Pi})$ and complex zeros at $z=r_{Oi} \exp(\pm j\phi_{Oi})$ $$H(z)_B = \pi^M_{i=1}(1 - 2r_{Oi} \cos \phi_{Oi} z^{-1} + r^2_{Oi} z^{-2})/(1 - 2r_{Pi} \cos \phi_{Pi} z^{-1} + r^2_{Pi} z^{-2}) \quad (11)$$

The relationship between the phase $\phi$ and the frequency for the poles and zeroes is given by $$\phi_P = 2\pi f_P / f_S \quad (12)$$

$$\phi_O = 2\pi f_O / f_S \quad (13)$$

where $f_S$ is the sampling frequency and $f_P$ and $f_O$ are the pole and zero frequencies respectively.

Figure 15:
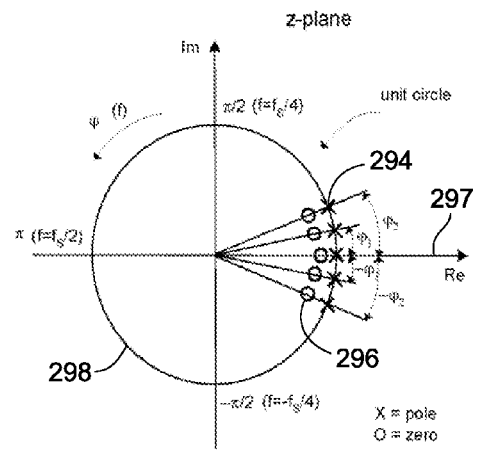
FIG. 15 is a graphical illustration of a pole-zero pattern for a fifth order Delta-Sigma-Delta modulator.

In a particular embodiment of the Delta-Sigma-Delta modulator 240, 262 and 265 of FIGS. 8, 13 and 14, poles of H(z) are placed on or slightly inside the unit circle. Complex pole frequencies are distributed to cover the signal band. Frequencies and magnitudes of zeros are determined in such a way to stabilize the loop and maximize the tracking performance. An example of pole-zero pattern for a $5^{th}$ order Delta-Sigma-Delta modulator is shown in FIG. 15, where poles 294 are marked with X's and zeros 296 with O's. In the diagram zeros 296 have the same frequencies as the poles 294, but they could have other frequencies. For purposes of illustration, the phases $\phi_1$ and $\phi_2$ are greatly exaggerated and the zeros 296 are far from the unit circle 298. In reality, due to oversampling, $f_B$ is much smaller than $f_S/2$ (the frequency axis of the analog domain is mapped onto the unit circle where 0° corresponds to the origin and 180° corresponds to $f_S/2$). As a consequence, poles 294 and zeros 296 are very close to the real axis 297 and zeros 296 are very close to the unit circle 298.

Modulators with higher order loop filters present the following advantages compared to traditional $2^{nd}$ order modulators: 1) At a parity of bandwidth they can achieve the same SNR with lower sampling frequencies; 2) At a parity of sampling frequency and signal bandwidth higher order loops have higher SNRs; 3) At a parity of sampling frequency they can achieve the same SNR over larger bandwidths.

The adoption of higher order loops eliminates most of the limitations that were preventing Delta modulator from being used as ADCs. However, this is achievable only using digital implementations of the higher order loops, because the realization of external analog higher order loops is unpractical. Therefore, higher order Delta modulators can, effectively, be used only in a Delta-Sigma-Delta modulator.

Figure 16:
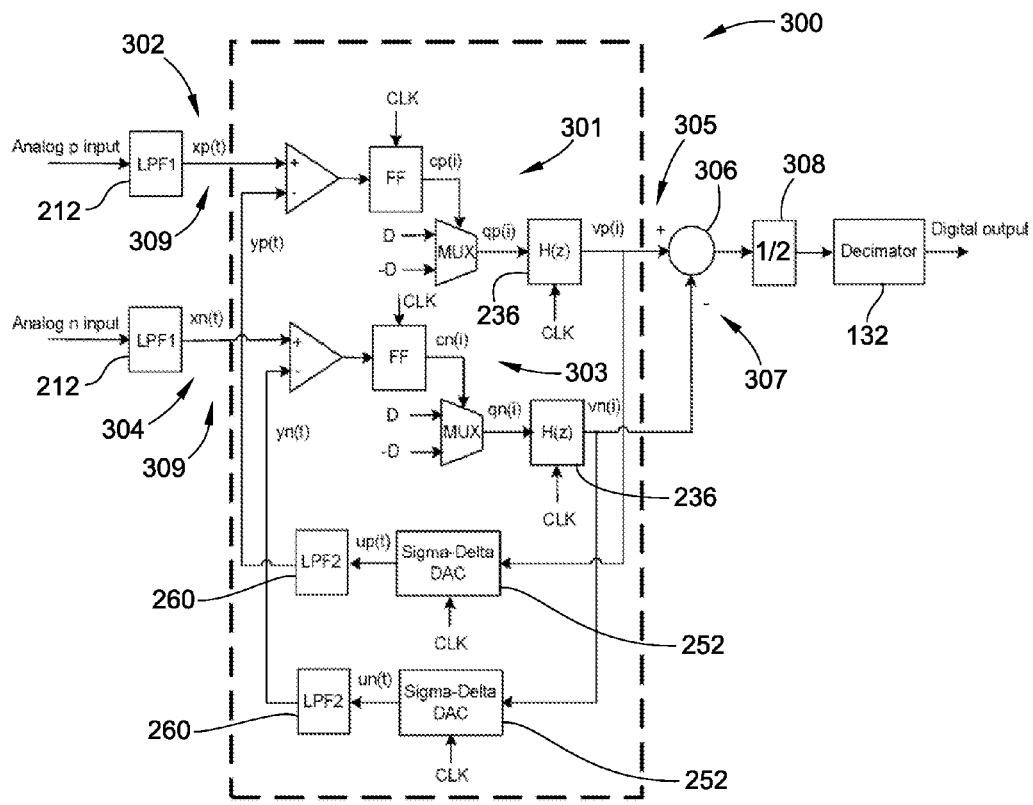
FIG. 16 is an illustration of an exemplary embodiment of the present invention for differential inputs.

In a particular embodiment shown in FIG. 16, an ADC 300 includes a first and a second Delta-Sigma-Delta modulator 301, 303. First and second Delta-Sigma-Delta modulators 301, 303 are driven by a low-pass filtered differential analog input signal 309. The low-pass filter 212 reduces the out-of-band noise. In at least one embodiment, the first and second Delta-Sigma-Delta modulators 301, 303 are identical. In the embodiment of FIG. 16, the first Delta-Sigma-Delta modulator 301 receives, as an input, a positive signal 302 of the differential analog input signal 309, and the second Delta-Sigma-Delta modulator 303 receives, as an input, a negative signal 304 of the differential analog input signal 309. This ADC 300 presents some advantages compared to traditional differential ADCs. First of all, the differential analog input signals 302 and 304 can use the full-scale voltage range instead of only half, as in analog circuits. Therefore, the first and second Delta-Sigma-Delta modulators 301, 303 can take advantage of the full dynamic range, thus minimizing the quantization noise. By using subtractor 306 to subtract the positive and negative channel outputs 305, 307 of the first and second Delta-Sigma-Delta modulators 301, 303, a signal with twice the amplitude of the input 302 or 304 is obtained, while common mode noise is canceled or significantly reduced. The output value of the subtractor 306 is halved by a divider 308, and downsampled by the decimator 132. In an embodiment, the output of the divider 308 is downsampled to a sampling rate having a frequency substantially equal to twice the bandwidth of the differential analog input signals 302, 304. Furthermore, the positive and negative channels are identical, except for the mismatches introduced by the few analog components. In legacy applications where the maximum amplitude of the inputs is only half scale, the divider 308 before the decimator 132 needs to be eliminated.

In at least one embodiment, multipliers and adders used to implement the two digital loop filters 236 of ADC 300 can be shared between the first and second Delta-Sigma-Delta modulators 301, 303. Similarly, multipliers and adders used to implement the two Sigma-Delta DACs 252 can also be shared, thus reducing the amount of hardware needed to fabricate the ADC 300. In this embodiment, only the memory registers used in the two digital loop filters 236 and two Sigma-Delta DACs 252 are kept separate. Further, it should be noted that all embodiments of Delta-Sigma-Delta modulators 240, 262, 265 described for FIGS. 8, 13 and 14 can be used in embodiments of FIG. 16.

Figure 17:
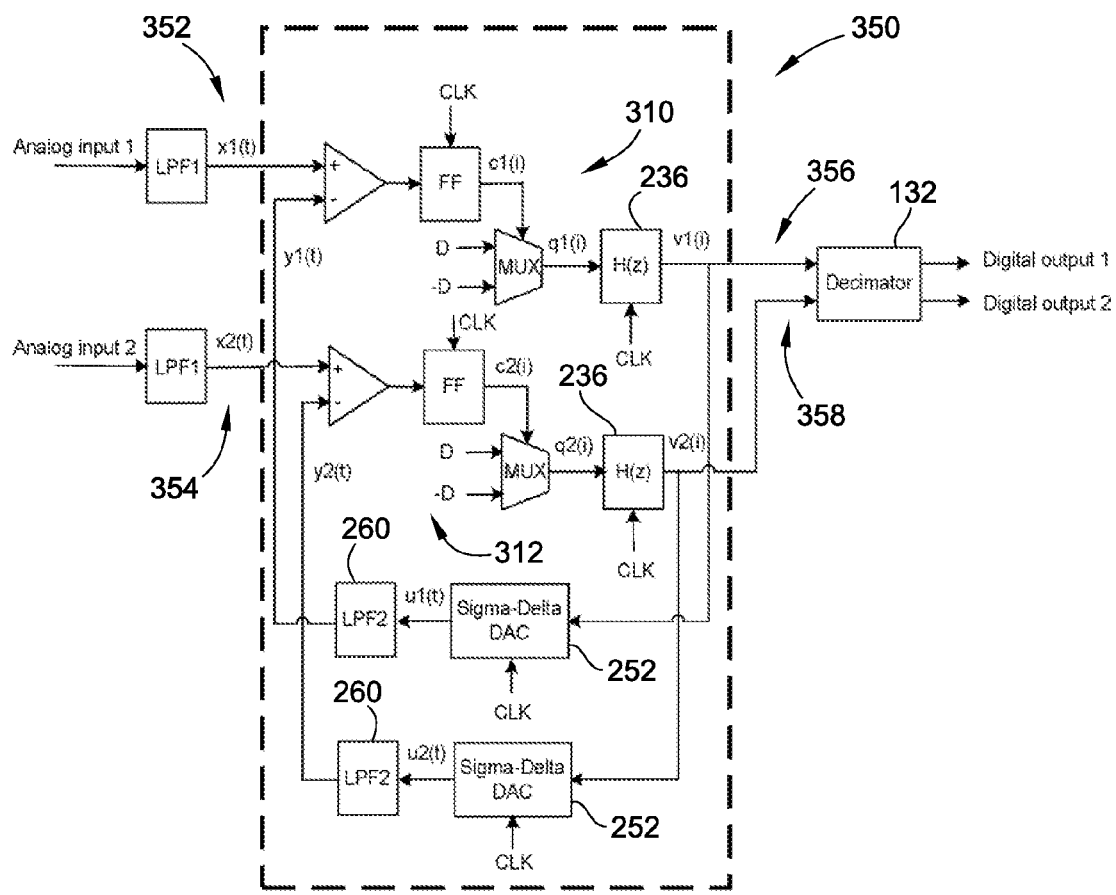
FIG. 17 is an illustration of an exemplary embodiment of the present invention for a dual-channel ADC.

In another embodiment, first and second Delta-Sigma-Delta modulators 310, 312 are used to implement a dual-channel ADC 350, as shown in FIG. 17. The structure is similar to the ADC 300 of FIG. 16, with the difference that now the first and second Delta-Sigma-Delta modulators 310, 312 are driven by two independent inputs 352 and 354. In at least one embodiment, the first and second Delta-Sigma-Delta modulators 310, 312 are identical. In the embodiment of FIG. 17, the first Delta-Sigma-Delta modulator 310 is configured to receive, as an input, a first analog input signal 352, and the second Delta-Sigma-Delta modulator 312 is configured to receive, as an input, a second analog input signal 354, and wherein the first analog input signal 352 is independent of the second analog input signal 354. In an embodiment of the invention, a first digital output 356 and a second digital output 358 of the loop filters 236 are decimated by two separate decimators 132. As shown in FIG. 17, to reduce silicon area, a single multiplexed decimator 132 can also be used. The same architecture can be extended to cover multi-channel implementations. In view of the fact that most of the circuitry is digital, this guarantees an almost perfect match of all the channel characteristics.

As with the ADC 300 of FIG. 16, in at least one embodiment, multipliers and adders used to implement the two digital loop filters 236 of ADC 350 can be shared between the first and second Delta-Sigma-Delta modulators 310, 312. Similarly, multipliers and adders used to implement the two Sigma-Delta DACs 252 can also be shared, thus reducing the amount of hardware needed to fabricate the dual-channel ADC 350. In this embodiment, only the memory registers used in the two digital loop filters 236 and two Sigma-Delta DACs 252 are kept separate. Further, it should be noted that all embodiments of Delta-Sigma-Delta modulators 240, 262, 265 described for FIGS. 8, 13 and 14 can be used in embodiments of FIG. 17.

Several Delta-Sigma-Delta modulators were simulated and tested in the lab with FPGA prototypes. In one instance, a resolution of 12 bits over a bandwidth of 15 kHz was achieved. Delta and Sigma-Delta technologies have been combined to develop embodiments of a novel Delta-Sigma-Delta ADC that requires only a few analog components, mainly a comparator and a simple low-pass smoothing filter. The comparator can be implemented with a digital differential input cell or a low-voltage differential signal (LVDS) input cell 228 easily available in most of the digital libraries for integrated circuits. The analog filter can be implemented with RC circuits using non-critical component values.

Referring to FIGS. 8, 13, 14, 16 and 17, embodiments of the novel Delta-Sigma-Delta ADC include modified Delta modulators 240, 262 and 265 with a digital feedback loop closed through a Sigma-Delta DAC 252. The performance of the ADC depends somewhat on the digital loop filter 236. Poles and zeros can be placed accurately in the digital domain, and are largely unaffected by process changes or temperature variations. Since the task of the smoothing filter 260 is to reject the noise produced by the Sigma-Delta DAC 252, it is not directly involved in the tracking process. As a consequence, the component accuracy is not critical and has little effect on the overall performance of the ADC.

Since most of the circuitry is digital, the Delta-Sigma-Delta ADC has many advantages over traditional ADCs. In particular, all components of the Delta-Sigma-Delta ADC can be easily implemented in digital CMOS technology, and, more particularly, in CMOS gate-array and FPGA technology or radiation-hardened CMOS technology, without requiring any special processing step. Also, the Delta-Sigma-Delta ADC can be used in very low power integrated circuits (ICs), and, as stated above, is suitable for radiation-hardened environments. Furthermore, the novel Delta-Sigma-Delta ADC has an extremely low offset drift.

With the development of higher order loops, the performance of the classic Delta modulator has been improved beyond the limits of the $2^{nd}$ order loops described in the literature, thus making possible the use of Delta-Sigma-Delta ADCs in a much wider range of applications. Potential applications cover areas where Sigma-Delta ADCs are currently used such as voice, sensors (consumer and industrial), and precision measurement devices. Various other potential applications are also envisioned such as military, space and avionics as well as use in low-power, portable electronic devices.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An Analog-to-Digital converter comprising:
a Delta-Sigma-Delta modulator having a modulator input configured to receive an analog input signal (x(t)), and a modulator output configured to supply a digital signal (v(i)), the digital signal being a digital estimate (v(i)) of the analog input signal;
wherein the Delta-Sigma-Delta modulator comprises:
a comparator having a first input for receiving the analog input signal (x(t)), a second input for receiving an analog estimate (y(t)) of the analog input signal, and a comparator output, wherein the comparator output comprises a digital quantized tracking error signal (q(i));
a digital loop fitter coupled to the comparator output and responsive to the digital quantized tracking error signal (q(i)) for providing, on the modulator output, the digital estimate(v(i)) of the analog input signal; and
a Sigma-Delta Digital-to-Analog Converter (DAC) configured to convert the digital estimate (v(i)) of the analog input signal into the analog estimate (y(t)) of the analog input signal.

2. The Analog-to-Digital converter of claim 1, wherein the Sigma-Delta DAC is coupled to a smoothing filter in a feedback loop connected to the modulator output and to the second input of the comparator, the smoothing filter configured to remove quantization noise generated by the Sigma-Delta DAC.

3. The Analog-to-Digital converter of claim 2, further comprising an interpolator coupled to the modulator output and to an input of the Sigma-Delta DAC, wherein the smoothing filter is coupled to an output of the Sigma-Delta DAC, and the interpolator is configured to operate the Sigma-Delta DAC at a higher clock speed than the digital loop fitter.

4. The Analog-to-Digital converter of claim 1, wherein the Delta-Sigma-Delta modulator further comprises a flip flop coupled to the comparator output, and a multiplexer coupled between the flip-flop and the digital loop filter.

5. The Analog-to-Digital converter of claim 1, further comprising:
a decimator coupled to the modulator output, and configured to downsample that modulator output signal to a sampling rate having a frequency substantially equal to twice the input signal bandwidth; and
a low-pass filter having an output coupled to the modulator input, the low-pass filter configured to remove out-of-band noise from the analog input signal.

6. The Analog-to-Digital converter of claim 1, wherein the Delta-Sigma-Delta modulator comprises a first Delta-Sigma-Delta modulator, the Analog-to-Digital converter further comprising a second Delta-Sigma-Delta modulator; and
wherein the first Delta-Sigma-Delta modulator receives, as an input, a positive signal of a differential analog input signal, and the second Delta-Sigma-Delta modulator receives, as an input, a negative signal of the differential analog input signal.

7. The Analog-to-Digital converter of claim 6, further comprising:
a subtractor configured to subtract an output value of the second Delta-Sigma-Delta modulator from an output value of the first Delta-Sigma-Delta modulator;
a divider coupled to an output of the subtractor, the divider configured to divide, in half, an output value of the subtractor output; and
a decimator coupled to an output of the divider, the decimator configured to receive an output from the divider and to downsample the output of the divider to a sampling rate having a frequency substantially equal to twice the input signal bandwidth.

8. The Analog-to-Digital converter of claim 1, wherein the Delta-Sigma-Delta modulator comprises a first Delta-Sigma-Delta modulator, the Analog-to-Digital converter further comprising a second Delta-Sigma-Delta modulator; and
wherein the first Delta-Sigma-Delta modulator is configured to receive, as an input, a first analog input signal, and the second Delta-Sigma-Delta modulator is configured to receive, as an input, a second analog input signal, and wherein the first analog input signal is independent of the second analog input signal.

9. The Analog-to-Digital converter of claim 8, further comprising:
a first decimator configured to receive an output signal from the first Delta-Sigma-Delta modulator, and to downsample that first Delta-Sigma-Delta modulator output signal to a sampling rate having a frequency substantially equal to twice the signal bandwidth of the first analog input signal; and
a second decimator configured to receive an output signal from the second Delta-Sigma-Delta modulator, and to downsample that second Delta-Sigma-Delta modulator output signal to a sampling rate having a frequency substantially equal to twice the signal bandwidth of the second analog input signal.

10. The Analog-to-Digital converter of claim 1, wherein the digital loop filter has a transfer function with a plurality of real poles and zeroes and a plurality of complex poles and zeroes such that the digital loop filter is a third-order or higher digital loop filter.

11. The Analog-to-Digital converter of claim 10, wherein the digital loop filter is a fifth order digital loop filter.

12. The Analog-to-Digital converter of claim 1, wherein the comparator is implemented with a low-voltage differential signal (LVDS) input.

13. The Analog-to-Digital converter of claim 1, wherein all digital components of the Delta-Sigma-Delta modulator are implemented in an FPGA.

14. The Analog-to-Digital converter of claim 1, wherein all components of the Delta-Sigma-Delta modulator are manufactured using a CMOS process.

15. The Analog-to-Digital converter of claim 1, wherein all components of the Delta-Sigma-Delta modulator are manufactured using a radiation-hardened CMOS process.

16. The analog-to-digital converter of claim 1, wherein all components of the Delta-Sigma-Delta modulator are manufactured in a gate-array.

17. The Analog-to-Digital converter of claim 1, wherein the comparator is implemented with a digital differential input.

18. An Analog-to-Digital converter comprising:
a Delta-Sigma-Delta modulator having a modulator input configured to receive an analog input signal (x(t)), and a modulator output configured to supply a digital signal (v(i)), the digital signal being a digital estimate (v(i)) of the analog input signal;
wherein the Delta-Sigma-Delta modulator comprises:
a multi-bit quantizer having a first input for receiving the analog input signal (x(t)), a second input for receiving an analog estimate (v(t)) of the analog input signal, and a multi-bit quantizer output, wherein the multi-bit quantizer output comprises a digital quantized tracking error (q(i));
a digital loop fitter coupled to the multi-bit quantizer output and responsive to the digital quantized tracking error (q(i)) for providing, on the modulator output, the digital estimate (v(i)) of the analog input signal; and a Sigma-Delta Digital-to-Analog Converter (DAC) configured to convert the digital estimate (v(i)) of the analog input signal into the analog estimate (v(t)) of the analog input signal.

19. The Analog-to-Digital converter of claim 18, wherein the Sigma-Delta DAC is coupled to a smoothing filter in a feedback loop connected to the modulator output and to the second input of the multi-bit quantizer, the smoothing filter configured to remove quantization noise generated by the Sigma-Delta DAC, and wherein the Delta-Sigma-Delta modulator further comprises an interpolator coupled to the modulator output and to an input of the Sigma-Delta DAC, wherein the smoothing fitter is coupled to an output of the Sigma-Delta DAC, and the interpolator is configured to operate the Sigma-Delta DAC at a higher clock speed than the digital loop filter.

20. The Analog-to-Digital converter of claim 18, wherein the Delta-Sigma-Delta modulator comprises a first Delta-Sigma-Delta modulator, the Analog-to-Digital converter further comprising a second Delta-Sigma-Delta modulator;

wherein the first Delta-Sigma-Delta modulator receives, as an input, a positive signal of a differential analog input signal, and the second Delta-Sigma-Delta modulator receives, as an input, a negative signal of the differential analog input signal; and wherein the Analog-to-Digital converter further comprises a subtractor configured to subtract an output value of the second Delta-Sigma-Delta modulator from an output value of the first Delta-Sigma-Delta modulator;

a divider coupled to an output of the subtractor, the divider configured to divide, in half, an output value of the subtractor output; and a decimator coupled to an output of the divider, the decimator configured to receive an output from the divider and to downsample the output of the divider to a sampling rate having a frequency substantially equal to twice the input signal bandwidth.

21. The Analog-to-Digital converter of claim 18, wherein the Delta-Sigma-Delta modulator comprises a first Delta-Sigma-Delta modulator, the Analog-to-Digital converter further comprising a second Delta-Sigma-Delta modulator;

wherein the first Delta-Sigma-Delta modulator is configured to receive, as an input, a first analog input signal, and the second Delta-Sigma-Delta modulator is configured to receive, as an input, a second analog input signal, and wherein the first analog input signal is independent of the second analog input signal; and wherein the Analog-to-Digital converter further comprises a first decimator configured to receive an output signal from the first Delta-Sigma-Delta modulator, and to downsample that first Delta-Sigma-Delta modulator output signal to a sampling rate having a frequency substantially equal to twice the signal bandwidth of the first analog input signal, and a second decimator configured to receive an output signal from the second Delta-Sigma-Delta modulator, and to downsample that second Delta-Sigma-Delta modulator output signal to a sampling rate having a frequency substantially equal to twice the signal bandwidth of the second analog input signal.

22. The Analog-to-Digital converter of claim 18, wherein the digital loop filter has a transfer function with a plurality of real poles and zeroes and a plurality of complex poles and zeroes such that the digital loop filter is a third-order or higher digital loop filter.

23. The Analog-to-Digital converter of claim 22, wherein the digital loop filter is a fifth order digital loop filter.

24. The Analog-to-Digital converter of claim 18, wherein all digital components of the Delta-Sigma-Delta modulator are implemented in an FPGA.

25. The Analog-to-Digital converter of claim 18, wherein all components of the Delta-Sigma-Delta modulator are manufactured using a CMOS process.

26. The Analog-to-Digital converter of claim 18, wherein all components of the Delta-Sigma-Delta modulator are manufactured using a radiation-hardened CMOS process.

27. The Analog-to-Digital converter of claim 18, wherein all components of the Delta-Sigma-Delta modulator are manufactured in a gate-array.

28. A method of Analog-to-Digital conversion comprising the steps of:

receiving, as an input to a Delta-Sigma-Delta modulator, an analog input signal (x(t));

comparing a voltage level of the analog input signal (x(t)) to a voltage level of an analog estimate (v(t)) of the analog input signal, wherein the analog estimate (v(t)) of the analog input signal is provided by a feedback loop and wherein comparing provides a digital quantized tracking error (q(i));

generating a digital estimate (v(i)) of the analog input signal by filtering, with a digital loop filter, the digital quantized tacking error (q)i)) of the comparison of the voltage level of the analog input signal (x(t)) to the voltage level of the analog estimate (v(t)) of the analog input signal; and converting, via a Sigma-Delta Digital-to-Analog converter (DAC) in the feedback loop, the digital estimate (v(i)) of the analog input signal into the analog estimate (v(t)) of the analog input signal.

29. The method of claim 28, wherein converting a digital estimate of the analog input signal into an analog estimate of the analog input signal comprises constructing the feedback loop with the Sigma-Delta DAC coupled to a smoothing filter.

30. The method of claim 29, further comprising increasing a sampling rate of the Sigma-Delta DAC by coupling an interpolator to the Sigma-Delta DAC in the feedback loop.

31. The method of claim 28, wherein receiving, as an input to a the Delta-Sigma-Delta modulator, the analog input signal (x(t)) comprises receiving, as an input to a first Delta-Sigma-Delta modulator, a first analog input signal (x1(t)), and wherein the method further comprises receiving, as an input to a second Delta-Sigma-Delta modulator, a second analog input signal (x2(t)), wherein the first and second analog input signals are independent of each other.

32. The method of claim 31, further comprising supplying an output of the first Delta-Sigma-Delta modulator to a first decimator, and supplying an output of the second Delta-Sigma-Delta modulator to a second decimator, each decimator configured to downsample the corresponding Delta-Sigma-Delta modulator output to a sampling rate having a frequency substantially equal to twice the corresponding Delta-Sigma-Delta modulator input signal bandwidth.

33. The method of claim 28, wherein receiving, as an input to the Delta-Sigma-Delta modulator, the analog input signal comprises receiving, as an input to a first Delta-Sigma-Delta modulator, a positive signal (xp(t)) of a differential analog input signal, and wherein the method further comprises receiving, as an input to a second Delta-Sigma-Delta modulator, a negative signal (xn(t)) of a differential analog input signal.

34. The method of claim 33, further comprising:
supplying outputs of the first and second Delta-Sigma-Delta modulators to a subtractor configured to subtract an output value (vn(i)) of the second Delta-Sigma-Delta modulator from an output value (vp(i)) of the first Delta-Sigma-Delta modulator;
supplying an output of the subtractor to a divider configured to divide, in half, an output value of the subtractor, and
supplying an output of the divider to a decimator, configured to downsample the divider output to a sampling rate having a frequency substantially equal to twice a signal bandwidth of the first Delta-Sigma-Delta modulator analog input signal.

35. A Delta-Sigma-Delta modulator having a modulator input configured to receive an analog input signal (x(t)), and a modulator output configured to supply a digital output signal (v(i)), the digital output signal being a digital estimate v(i)) of the analog input signal,
the Delta-Sigma-Delta modulator comprising:
a comparator having a first input for receiving the analog input signal (x(t)) and a second input for receiving an analog estimate (v(t)) of the analog input signal, wherein responsive to receiving the analog input signal and the analog estimate of the analog input signal, the comparator is configured to output a digital quantized error signal (q(i));
a digital loop filter, responsive to the digital quantized error signal (q(i)), configured to provide, on the modulator output, the digital estimate (v(i)) of the analog input signal; and
a Sigma-Delta Digital-to-Analog Converter (DAC) configured to convert the digital estimate (v(i)) of the analog input signal into the analog estimate (v(t)) of the analog input signal.

36. The Delta-Sigma-Delta modulator of claim 35, wherein the comparator is implemented with a digital differential input.

37. The Delta-Sigma-Delta modulator of claim 35, wherein the comparator is implemented with a low-voltage differential signal (LVDS) input.

38. The Delta-Sigma-Delta modulator of claim 35, further comprising a multi-bit quantizer having a first input for receiving the analog input signal, a second input for receiving the analog estimate of the analog input signal, and an output coupled to the digital loop filter.

39. The Delta-Sigma-Delta modulator of claim 35, wherein all digital components of the Delta-Sigma-Delta modulator are implemented in an FPGA.

40. The Delta-Sigma-Delta modulator of claim 35, wherein all digital components of the Delta-Sigma-Delta modulator are manufactured using a CMOS process.

41. The Delta-Sigma-Delta modulator of claim 35, wherein all components of the Delta-Sigma-Delta modulator are manufactured using a radiation-hardened CMOS process.

42. The Delta-Sigma-Delta modulator of claim 35, wherein all components of the Delta-Sigma-Delta modulator are manufactured in a gate-array.

43. The Delta-Sigma-Delta modulator of claim 35, wherein the digital loop filter has a transfer function with a plurality of real poles and zeroes and a plurality of complex poles and zeroes such that the digital loop filter is a third-order or higher digital loop filter.

44. The Delta-Sigma-Delta modulator of claim 43, wherein the digital loop filter is a fifth order digital loop filter.

* * * * *